(12) United States Patent
Nitta et al.

(10) Patent No.: US 10,032,629 B2
(45) Date of Patent: Jul. 24, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takafumi Nitta, Toyama (JP); Satoshi Shimamoto, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/274,140

(22) Filed: Sep. 23, 2016

(65) Prior Publication Data
US 2017/0092486 A1 Mar. 30, 2017

(30) Foreign Application Priority Data

Sep. 25, 2015 (JP) ................................. 2015-188275

(51) Int. Cl.
| | |
|---|---|
| H01L 21/02 | (2006.01) |
| C23C 16/46 | (2006.01) |
| C23C 16/24 | (2006.01) |
| C23C 16/52 | (2006.01) |
| C23C 16/44 | (2006.01) |
| C23C 16/455 | (2006.01) |

(52) U.S. Cl.
CPC .......... *H01L 21/0262* (2013.01); *C23C 16/24* (2013.01); *C23C 16/44* (2013.01); *C23C 16/45523* (2013.01); *C23C 16/46* (2013.01); *C23C 16/52* (2013.01); *H01L 21/02208* (2013.01); *H01L 21/02271* (2013.01); *H01L 21/02532* (2013.01)

(58) Field of Classification Search
CPC .......... H01L 21/0262; H01L 21/02532; H01L 21/02208; H01L 21/02271; H01L 21/02381; H01L 21/02639; H01L 21/02488; H01L 21/76262; H01L 29/4908; C23C 16/44; C23C 16/45523; C23C 16/46; C23C 16/24; C23C 16/52; C30B 29/06
USPC ........................................................ 438/478
See application file for complete search history.

(56) References Cited

U.S. PATENT DOCUMENTS 6,372,558 B1 * 4/2002 Yamanaka .......... G02F 1/13454
257/E21.104
2013/0109155 A1 5/2013 Okada et al.

FOREIGN PATENT DOCUMENTS

JP 2013-095945 A 5/2013

\* cited by examiner

*Primary Examiner* — Caleen Sullivan
(74) *Attorney, Agent, or Firm* — Volpe and Koenig, P.C.

(57) ABSTRACT

A method of manufacturing a semiconductor device includes: providing a substrate; and forming a film on the substrate by supplying a silicon hydride and a halogen element-free catalyst containing one of a group III element or a group V element to the substrate, under a condition that the silicon hydride is not thermally decomposed when the silicon hydride is present alone.

16 Claims, 8 Drawing Sheets

METHOD OF MANUFACTURING SEMICONDUCTOR DEVICE, SUBSTRATE PROCESSING APPARATUS, AND RECORDING MEDIUM

BACKGROUND

Technical Field

The present disclosure relates to a method of manufacturing a semiconductor device, a substrate processing apparatus, and a non-transitory computer-readable recording medium.

Related Art

As one of the processes of manufacturing a semiconductor device, a process of supplying a silicon hydride to a substrate to form a film including silicon (Si) on the substrate is performed. By supplying a gas having a catalytic action, such as a trichloroborane ($BCl_3$), together with a silicon hydride, it is possible to perform a film-forming process at a relatively low temperature and to improve a thermal history or the like experienced by a semiconductor device (see, for example, JP 2011-216784 A).

SUMMARY

It is an object of the present disclosure to provide a technology that is capable of improving a film quality of a film to be formed on a substrate.

According to one aspect of the present disclosure, a technology including: providing a substrate; and forming a film on the substrate by supplying a silicon hydride and a halogen element-free catalyst containing one of a group III element or a group V element to the substrate, under a condition that the silicon hydride is not thermally decomposed when the silicon hydride is present alone is provided.

According to the present disclosure, it is possible to improve a film quality of a film to be formed on a substrate.

DETAILED DESCRIPTION

Embodiment of the Present Disclosure

Hereinafter, an embodiment of the present disclosure will be described with reference to FIGS. 1 to 3.

(1) Configuration of Substrate Processing Apparatus

Figure 1:
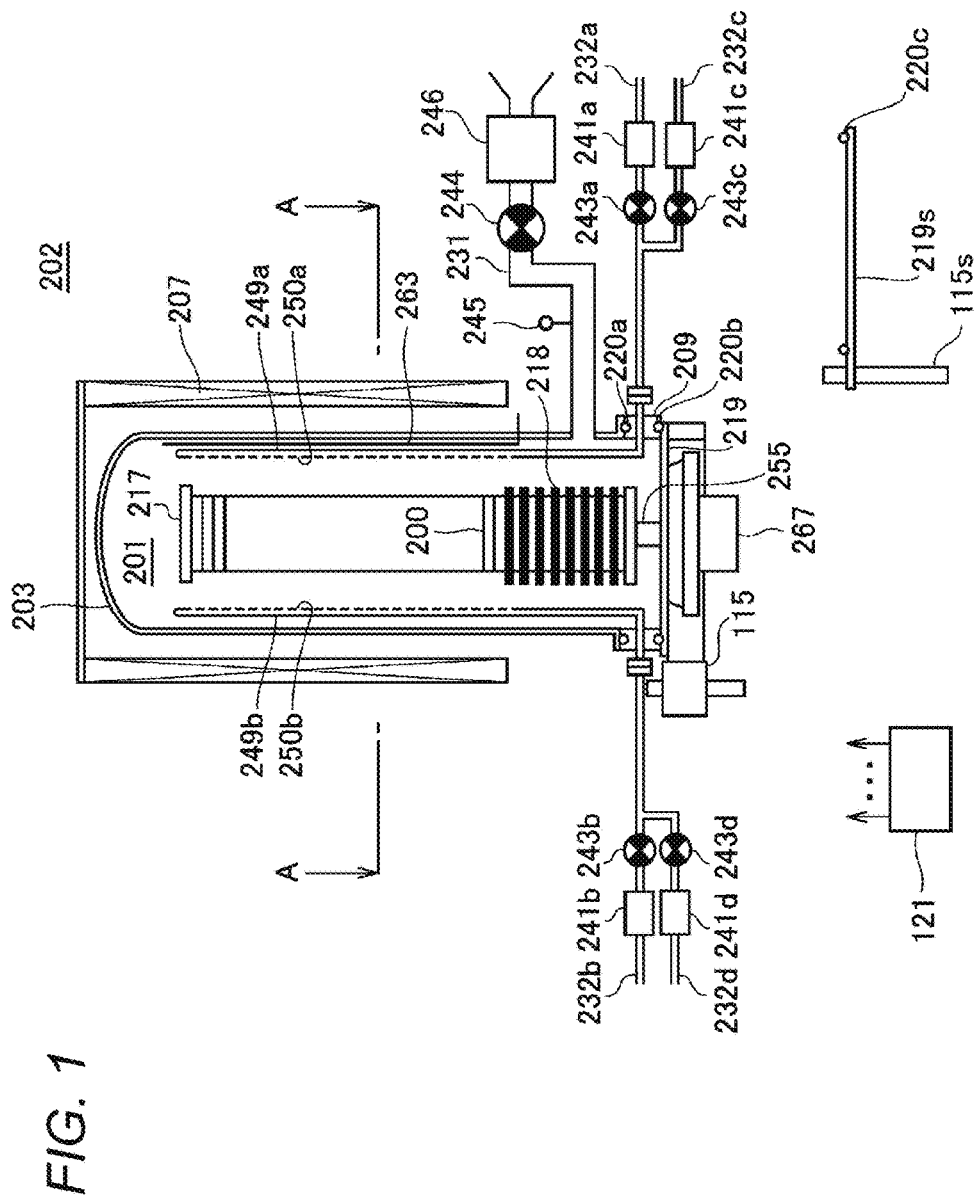
FIG. 1 is a schematic configuration diagram of a vertical process furnace of a substrate processing apparatus suitably used in an embodiment of the present disclosure and a longitudinal sectional view of a process furnace part.
Figure 2:
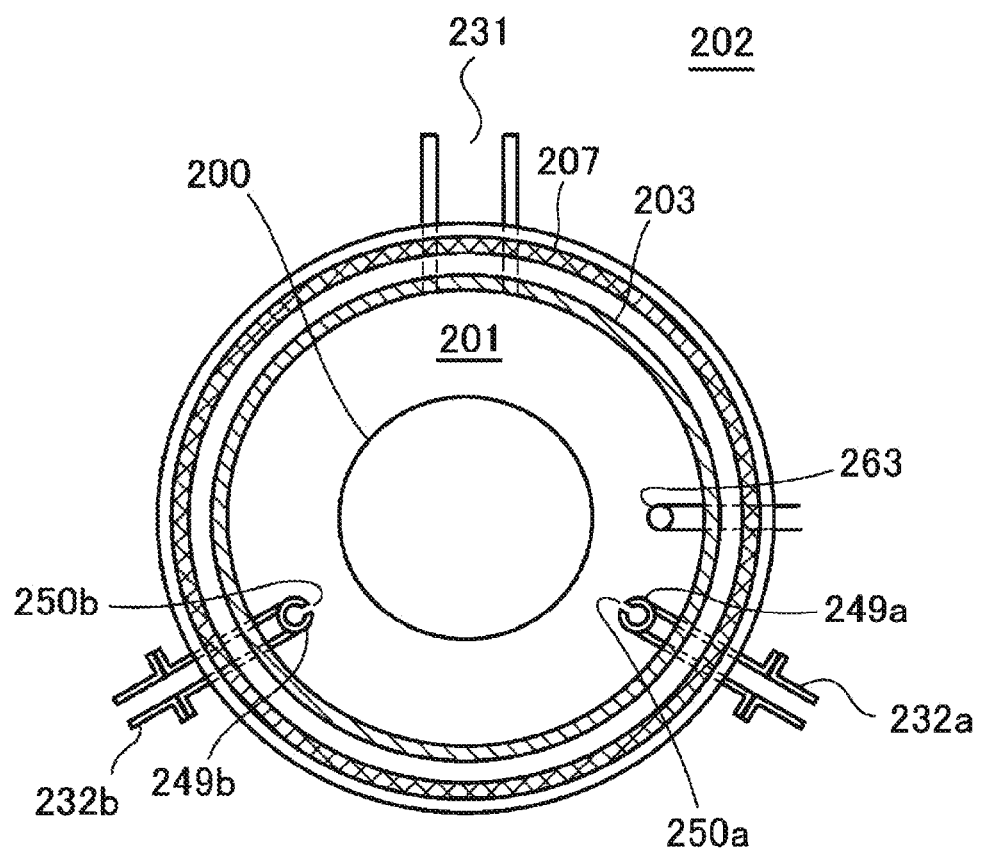
FIG. 2 is a schematic configuration diagram of a portion of the vertical process furnace of the substrate processing apparatus suitably used in the embodiment of the present disclosure and a sectional view of a portion of the process furnace taken along line A-A of FIG. 1.

As illustrated in FIG. 1, a process furnace 202 includes a heater 207 serving as a heating mechanism (temperature regulation unit). The heater 207 has a cylindrical shape and is supported to a heater base (not illustrated) serving as a holding plate so that the heater 207 is vertically installed. As described below, the heater 207 functions as an activation mechanism (excitation unit) that activates (excites) a gas by heat.

Inside the heater 207, a reaction tube 203 is disposed concentrically with the heater 207. The reaction tube 203 is made of a heat resistant material, such as quartz ($SiO_2$) or silicon carbide (SiC), and is formed to have a cylindrical shape with a closed upper end and an opened lower end. Under the reaction tube 203, a manifold (inlet flange) 209 is disposed concentrically with the reaction tube 203. The manifold 209 is made of a metal, which may be stainless steel (SUS), and is formed to have a cylindrical shape with opened upper and lower ends. An upper part of the manifold 209 is configured to be engaged with a lower part of the reaction tube 203 so as to support the reaction tube 203. An O-ring 220a serving as a seal member is provided between the manifold 209 and the reaction tube 203. Since the manifold 209 is supported to the heater base, the reaction tube 203 is in a state of being vertically installed. The process vessel (reaction vessel) is configured by, mainly, the reaction tube 203 and the manifold 209. A process chamber 201 is formed in a cylindrical hollow part of the process vessel. The process chamber 201 is configured such that wafers 200 as a plurality of sheets of substrates is accommodated in a state of being aligned vertically in a horizontal posture and in multiple stages by a boat 217 to be described below.

In the process chamber 201, nozzles 249a and 249b are provided to pass through a sidewall of the manifold 209. Gas supply pipes 232a and 232b are respectively connected to the nozzles 249a and 249b. As such, the two nozzles 249a and 249b and the two gas supply pipes 232a and 232b are provided in the process vessel (manifold 209), such that a plurality of types of gases is supplied into the process chamber 201.

Mass flow controllers (MFCs) 241a and 241b serving as flow rate controllers (flow rate control units) and valves 243a and 243b serving as on-off valves are respectively provided in the gas supply pipes 232a and 232b in this order in a direction from an upstream side. Gas supply pipes 232c and 232d configured to supply an inert gas are respectively connected to downstream sides of the valves 243a and 243b of the gas supply pipes 232a and 232b. MFCs 241c and 241d serving as flow rate controllers (flow rate control units) and valves 243c and 243d serving as on-off valves are respectively provided in the gas supply pipes 232c and 232d in this order in a direction from the upstream side.

The nozzles 249a and 249b are respectively connected to tip end portions of the gas supply pipes 232a and 232b. As illustrated in FIG. 2, the nozzles 249a and 249b are respectively provided in an annular space between an inner wall of the reaction tube 203 and the wafers 200, when seen in a plan view, so as to rise upward in a stacking direction of the wafers 200, extending from a lower part to an upper part of the inner wall of the reaction tube 203. That is, the nozzles 249a and 249b are provided in a region horizontally surrounding a wafer arrangement region, at a side of the wafer arrangement region in which the wafers 200 are arranged, so as to extend along the wafer arrangement region. In other words, the nozzles 249a and 249b are respectively provided perpendicular to a surface (flat surface) of the wafer 200 at a side of an edge (periphery) of each wafer 200 loaded into the process chamber 201. Each of the nozzles 249a and 249b is configured as an L-shaped long nozzle, a horizontal part of which is provided so as to pass through the sidewall of the manifold 209 and a vertical part of which is provided so as to rise from at least one end side toward the other end side of the wafer arrangement region. Gas supply holes 250a and 250b configured to supply a gas are respectively provided on side surfaces of the nozzles 249a and 249b. The gas supply holes 250a and 250b are opened to face the center of the reaction tube 203, so that the gas is supplied toward the wafer 200. A plurality of the gas supply holes 250a and 250b are provided from the lower part to the upper part of the reaction tube 203, such that the plurality of gas supply holes 250a and 250b have the same opening area and are provided at the same opening pitch.

As such, in the present embodiment, the gas is transferred through the nozzles 249a and 249b disposed in the annular elongated space, when seen in a plan view, that is, the cylindrical space, which is defined by the inner wall of the sidewall of the reaction tube 203 and the ends (peripheries) of the plurality of sheets of wafers 200 arranged in the reaction tube 203. The gas is ejected from the gas supply holes 250a and 250b, which are respectively opened in the nozzles 249a and 249b, to the reaction tube 203 for the first time in the vicinity of the wafer 200. A main flow of the gas in the reaction tube 203 is a direction parallel to the surface of the wafer 200, that is, a horizontal direction. Due to such a configuration, it is possible to uniformly supply the gas to each of the wafers 200 and to improve the film thickness uniformity of a thin film formed in each of the wafers 200. A gas flowing on the surface of the wafer 200, that is, a gas remaining after reaction, flows in a direction of an exhaust port, that is, an exhaust pipe 231 to be described below. However, the direction of the flow of the remaining gas is appropriately specified according to the position of the exhaust port and is not limited to a vertical direction.

A silicon hydride (hydrogenated silane) is supplied from the gas supply pipe 232a to the process chamber 201 through the MFC 241a, the valve 243a, and the nozzle 249a. The silicon hydride is a hydrogen compound of silicon and is a silane source that contains silicon (Si) and hydrogen (H) and does not contain carbon (C) and nitrogen (N). The silicon hydride is a silane source that does not contain a halogen element, such as chlorine (Cl), fluorine (F), bromine (Br), and iodine (I). When the term "source" is used in the present disclosure, it may be understood as "a liquid source that is in a liquid state", "a source (source gas) that is in a gaseous state", or both of them. As the silicon hydride, for example, a disilane ($Si_2H_6$, abbreviated to DS) gas can be used. The DS gas act as a Si source in a CVD film-forming step to be described below.

A halogen element-free catalyst containing one of a group III element or a group V element is supplied from the gas supply pipe 232b to the process chamber 201 through the MFC 241b, the valve 243b, and the nozzle 249b. As the catalyst, for example, a triethylborane (($CH_3CH_2)_3B$, abbreviated to TEB) gas, which is a type of alkylborane can be used. The TEB gas contains boron (B) as a group III element and is a gas that includes an ethyl group ($CH_3CH_2$) as an alkyl group and does not contain a halogen element such as Cl, F, Br, I, or the like. The TEB gas exhibits a catalytic action to accelerate the decomposition of the DS gas and accelerate the film-forming process in the CVD film-forming step to be described below. However, in some cases, a portion of a molecular structure of the TEB gas may be decomposed in the course of the film-forming process. As such, a gas that partially changes before and after a chemical reaction is not strictly a "catalyst." However, in the present disclosure, even in a case where a material is partially decomposed in the process of a chemical reaction, the material is referred to as a "catalyst" as long as it is not mostly decomposed and substantially acts as a catalyst by changing a reaction rate.

As the inert gas, for example, a nitrogen ($N_2$) gas is supplied from the gas supply pipes 232c and 232d into the process chamber 201 through the MFCs 241c and 241d, the valves 243c and 243d, the gas supply pipes 232a and 232b, and the nozzles 249a and 249b.

In a case where the silicon hydride is supplied from the gas supply pipe 232a, a silicon hydride supply system serving as a first supply system is configured by, mainly, the gas supply pipe 232a, the MFC 241a, and the valve 243a. The nozzle 249a may be included in the silicon hydride supply system. The silicon hydride supply system can also be referred to as a silicon hydride gas supply system, a source supply system, or a source gas supply system.

In a case where the catalyst is supplied from the gas supply pipe 232b, a catalyst supply system serving as a second supply system is configured by, mainly, the gas supply pipe 232b, the MFC 241b, and the valve 243b. The nozzle 249b may be included in the catalyst supply system. The catalyst supply system can also be referred to as a catalyst gas supply system. In a case where the above-mentioned alkylborane is supplied as the catalyst, the catalyst supply system can also be referred to as an alkylborane supply system or an alkylborane gas supply system.

In addition, an inert gas supply system is configured by, mainly, the gas supply pipes 232c and 232d, the MFCs 241c and 241d, and the valves 243c and 243d.

A supply system is configured by, mainly, the first supply system and the second supply system. The inert gas supply system may be included in the supply system.

An exhaust pipe 231, which exhausts the atmosphere of the process chamber 201, is provided in the reaction tube 203. In the exhaust pipe 231, a vacuum pump 246 serving as a vacuum exhaust device is connected through a pressure sensor 245 serving as a pressure detector (pressure detection unit), which detects a pressure in the process chamber 201, and an auto pressure controller (APC) valve 244 serving as a pressure regulator (pressure regulation unit). The APC valve 244 is a valve configured to start or stop a vacuum exhaust process in the process chamber 201 by opening and closing the valve while the vacuum pump 246 is operating, and to regulate the pressure in the process chamber 201 by adjusting the degree of valve opening based on pressure information detected by the pressure sensor 245 while the vacuum pump 246 is operating. An exhaust system is configured by, mainly, the exhaust pipe 231, the APC valve 244, and the pressure sensor 245. The vacuum pump 246 may be included in the exhaust system.

Under the manifold 209, a seal cap 219 is provided as a furnace throat lid that can airtightly close a lower end opening of the manifold 209. The seal cap 219 is configured to abut against a lower end of the manifold 209 from a lower side in a vertical direction. The seal cap 219 is made of a metal such as stainless steel (SUS) and is formed to have a disk shape. On the top surface of the seal cap 219, an O-ring 220b is provided as a seal member that abuts against the lower end of the manifold 209. A rotation mechanism 267 that rotates the boat 217 to be described below is installed at a side of the seal cap 219 opposite to the process chamber 201. A rotational shaft 255 of the rotation mechanism 267 passes through the seal cap 219 and is connected to the boat 217. The rotation mechanism 267 is configured to rotate the wafers 200 by rotating the boat 217. The seal cap 219 is configured such that the seal cap 219 is moved upward and downward by a boat elevator 115 serving as an elevation mechanism that is vertically installed outside the reaction tube 203. The boat elevator 115 is configured to load the boat 217 into the process chamber 201 or unload the boat 217 from the process chamber 201 by moving the seal cap 219 upward or downward. The boat elevator 115 is configured as a transfer device (transfer mechanism) that transfers the boat 217, that is, the wafers 200, to the inside or the outside of the process chamber 201. In addition, below the manifold 209, a shutter 219s is provided as a furnace throat lid that can airtightly close the lower end opening of the manifold 209 while the seal cap 219 is moved downward by the boat elevator 115. The shutter 219s is made of a metal, which may be stainless steel (SUS), and is formed to have a disk shape. On the top surface of the shutter 219s, an O-ring 220c is provided as a seal member that abuts against the lower end of the manifold 209. The opening/closing operation (the upward/downward moving operation, the rotating operation, or the like) of the shutter 219s is controlled by a shutter opening/closing mechanism 115s.

The boat 217 serving as a substrate supporter is configured such that a plurality of sheets of wafers 200, for example, 25 to 200 wafers, is vertically aligned and supported in a horizontal posture, with their centers aligned with one another, in multiple stages, that is, arranged spaced apart from one another. The boat 217 is made of, for example, a heat resistant material. The heat resistant material may be quartz or SiC. Below the boat 217, a heat insulation plate 218 made of, for example, a heat resistant material, which may be quartz or SiC, is configured to be supported in multiple stages. Due to this configuration, heat generated from the heater 207 is hardly transmitted toward the seal cap 219. However, the present embodiment is not limited to the above example. For example, instead of providing the heat insulation plate 218 below the boat 217, a heat insulation cylinder configured as a cylindrical member made of a heat resistant material such as quart or SiC may be provided.

A temperature sensor 263 serving as a temperature detector is installed in the reaction tube 203. An amount of current to be supplied to the heater 207 is adjusted based on temperature information detected by the temperature sensor 263, so that the temperature in the process chamber 201 has a desired temperature distribution. The temperature sensor 263 is configured to have an L shape similar to the nozzles 249a and 249b and is provided along the inner wall of the reaction tube 203.

Figure 3:
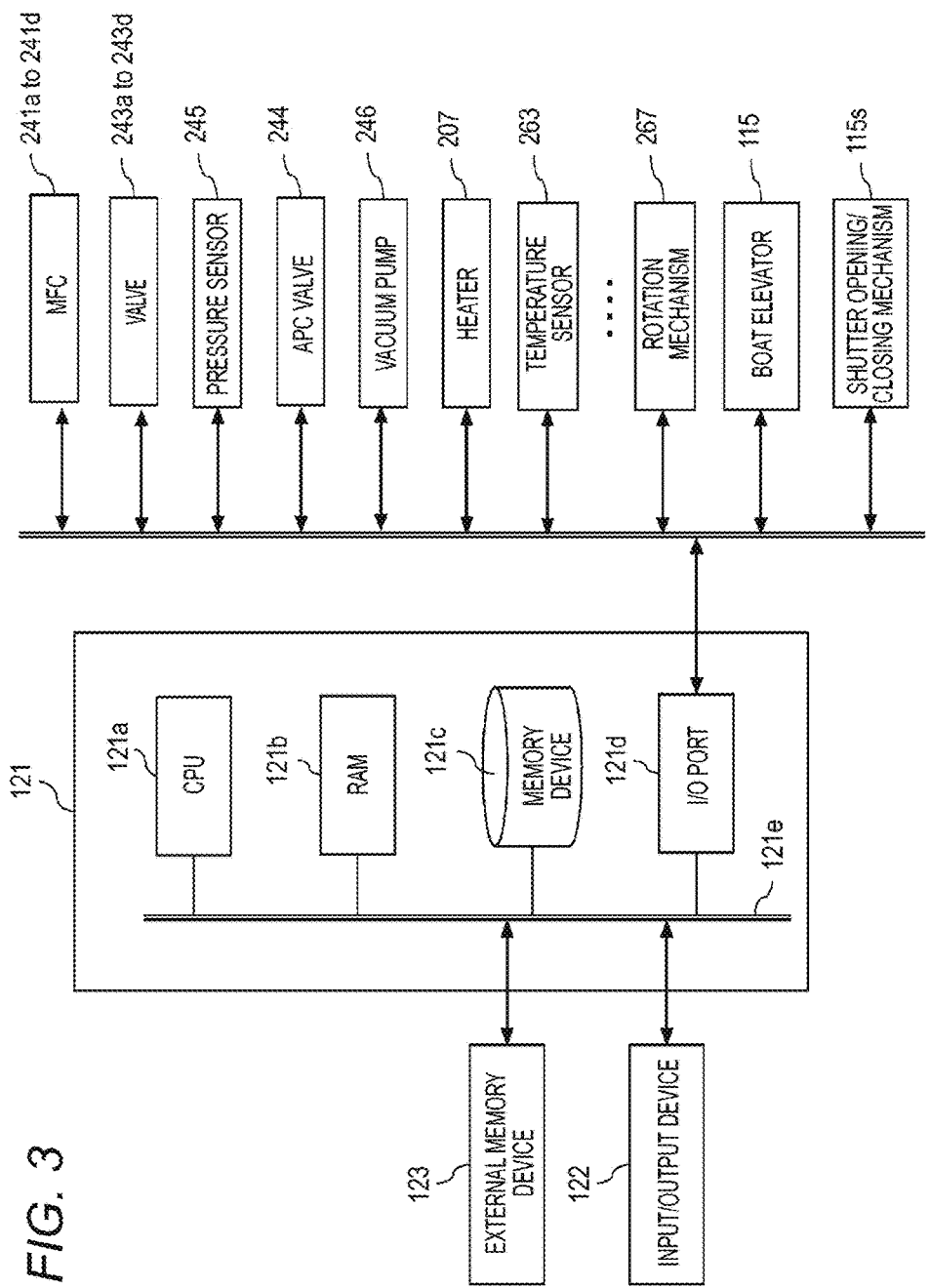
FIG. 3 is a schematic configuration diagram of a controller of the substrate processing apparatus suitably used in the embodiment of the present disclosure and a block diagram of a control system of the controller.

As illustrated in FIG. 3, a controller 121 being a control unit (control device) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, a flash memory or a hard disk drive (HDD). In the memory device 121c, a control program for controlling an operation of a substrate processing apparatus or a process recipe including procedures or conditions of a film-forming process to be described below is stored to be readable. The process recipe is a combination of sequences of a film-forming process to be described below so as to obtain a predetermined result when the sequences are performed by the controller 121, and functions as a program. Hereinafter, the process recipe, the control program, and the like will be simply and collectively referred to as a program. In addition, the process recipe is simply referred to as a recipe. When the term "program" is used in the present disclosure, it may be understood to include only a recipe alone, only a control program alone, or both of the recipe and the control program. The RAM 121b is configured as a memory area (work area) in which a program or data read by the CPU 121a is temporarily retained.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read and execute the control program from the memory device 121c and to read the recipe from the memory device 121c according to an input of an operation command received from the I/O device 122, or the like. According to the contents of the read recipe, the CPU 121a is configured to control the operation of adjusting the flow rates of various gases by using the MFCs 241a to 241d, the operation of opening/closing the valves 243a to 243d, the operation of opening/closing the APC valve 244, the operation of adjusting the pressure by using the APC valve 244 based on the pressure sensor 245, the operation of driving and stopping the vacuum pump 246, the operation of adjusting the temperature of the heater 207 based on the temperature sensor 263, the operation of rotating the boat 217 and adjusting the rotating speed of the boat 217 by using the rotation mechanism 267, the operation of moving the boat 217 upward or downward by using the boat elevator 115, the operation of opening and closing the shutter 219s by using the shutter opening/closing mechanism 115s, and the like.

The controller 121 can be configured by installing, on a computer, the program stored in an external memory device (for example, a magnetic tape, a magnetic disk such as a flexible disk or a hard disk, an optical disk such as a CD or a DVD, a magneto-optical disk such as an MO, or a semiconductor memory such as a USB or a memory card) 123. The memory device 121c or the external memory device 123 is configured as a non-transitory computer-readable recording medium. Hereinafter, the memory device 121c and the external memory device 123 may also be simply and collectively referred to as a recording medium. When the term "recording medium" is used in the present disclosure, it may be understood to include only the memory device 121c alone, only the external memory device 123 alone, or both of the memory device 121c and the external memory device 123. The provision of the program to the computer may be performed by using a communication means such as the Internet or dedicated line, without using the external memory device 123.

(2) Film-Forming Process

As one of the processes of manufacturing a semiconductor device, an example of a sequence of forming a film on a substrate by using the above-described substrate processing apparatus will be described with reference to FIG. 4A. In the following description, operations of the respective elements constituting the substrate processing apparatus are controlled by the controller 121.

Figure 4A:
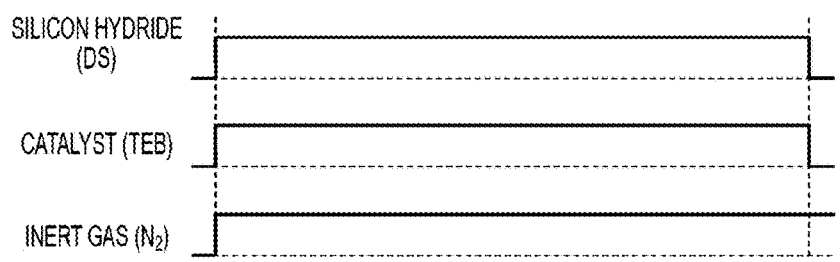
FIG. 4A is a diagram illustrating a film-forming sequence according to an embodiment of the present disclosure.

In the film-forming sequence illustrated in FIG. 4A, a silicon-containing film, that is, a silicon film (Si film) is formed on the wafer 200 by supplying the DS gas and the TEB gas to the wafer 200 as the substrate under a condition that the DS gas is not thermally decomposed when the DS gas is present alone.

In the present disclosure, for convenience, the film-forming sequence illustrated in FIG. 4A may be represented as follows. In the following descriptions of modification examples or other embodiments, the same notation will be used.

When the term "wafer" is used in the present disclosure, it may be understood as a wafer itself, or a laminate (aggregate) of a wafer and a predetermined layer or film formed on a surface thereof, that is, a wafer including a predetermined layer or film formed on a surface thereof. In addition, when the expression "a surface of a wafer" is used in the present disclosure, it may be understood as "a surface (exposed surface) of a wafer itself" or "a surface of a predetermined layer or film formed on a wafer, that is, an uppermost surface of a wafer as a laminate".

Thus, in the present disclosure, the expression "a predetermined gas is supplied to a wafer" may be understood to mean that "the predetermined gas is directly supplied to a surface (exposed surface) of a wafer itself" or mean that "the predetermined gas is supplied to a layer or film formed on a wafer, that is, an uppermost surface of a wafer as a laminate". In addition, in the present disclosure, the expression "a predetermined layer (or film) is formed on a wafer" may be understood to mean that "a predetermined layer (or film) is directly formed on a surface (exposed surface) of a wafer itself" or mean that "a predetermined layer (or film) is formed on a layer or film formed on a wafer, that is, an uppermost surface of a wafer as a laminate".

In addition, a case where the term "substrate" is used in the present disclosure is the same as the case where the term "wafer" is used.

(Substrate Providing Step)

When a plurality of sheets of wafers 200 is charged into the boat 217 (wafer charging), the shutter 219s is moved by the shutter opening/closing mechanism 115s and the lower end opening of the manifold 209 is opened (shutter opening). Subsequently, as illustrated in FIG. 1, the boat 217 that supports the plurality of sheets of wafers 200 is lifted by the boat elevator 115 and is loaded into the process chamber 201 (boat loading). In this state, the seal cap 219 is in a state of sealing the lower end of the manifold 209 through the O-ring 220b.

(Pressure and Temperature Adjusting Step)

The inside of the process chamber 201, that is, the space where the wafers 200 are present, is vacuum-exhausted (evacuated) to have a desired pressure (degree of vacuum) by the vacuum pump 246. In this case, the pressure in the process chamber 201 is measured by the pressure sensor 245, and the APC valve 244 is feedback-controlled based on information about the measured pressure. The vacuum pump 246 maintains a full-time operating state at least until the processing on the wafers 200 is completed. In addition, the wafer in the process chamber 201 is heated by the heater 207 until the wafers 200 have a desired film-forming temperature. In this case, an amount of current supplied to the heater 207 is feedback-controlled based on the temperature information detected by the temperature sensor 263, so that the inside of the process chamber 201 has a desired temperature distribution. The heating of the inside of the process chamber 201 by the heater 207 is continuously performed at least until the processing on the wafers 200 is completed. In addition, the rotation of the boat 217 and the wafers 200 is started by the rotation mechanism 267. The rotation of the boat 217 and the wafers 200 by the rotation mechanism 267 is continuously performed at least until the processing on the wafers 200 is completed.

(CVD Film-Forming Step)

In this step, the DS gas and the TEB gas are simultaneously supplied to the wafer 200 in the process chamber 201.

Specifically, the valves 243a and 243b are opened, so that the DS gas and the TEB gas flows into the gas supply pipe 232a and 232b. The DS gas and the TEB gas, the flow rates of which are respectively controlled by the MFC 241a and 241b, are supplied into the process chamber 201 through the nozzles 249a and 249b and are exhausted from the exhaust pipe 231. At this time, the DS gas and the TEB gas are simultaneously supplied to the wafer 200. At this time, the valves 243c and 243d are opened at the same time, and an N₂ gas flows into the gas supply pipes 232c and 232d. The flow rate of the N₂ gas is adjusted by the MFCs 241c and 241d, and the N₂ gas is supplied into the process chamber 201 together with the DS gas or the TEB gas and is exhausted from the exhaust pipe 231.

At this time, the APC valve 244 is appropriately adjusted such that the pressure in the process chamber 201 is set to a pressure within a range of, for example, 1 to 100 Pa, and preferably 20 to 100 Pa.

When the pressure in the process chamber 201 is less than 1 Pa, a film-forming reaction on the wafers 200 which is to be described below does not proceed, and thus, a practical deposition rate may not be obtained. By setting the pressure in the process chamber 201 to be 1 Pa or more, the film-forming reaction on the wafers 200 is made to proceed, and thus, a practical deposition rate can be obtained. By setting the pressure in the process chamber 201 to be 20 Pa or more, the film-forming reaction on the wafers 200 is accelerated, and thus, the deposition rate can be further increased.

When the pressure in the process chamber 201 is greater than 100 Pa, a waiting time when raising the pressure in the process chamber 201 increases, and thus, productivity of the film-forming process may be reduced. In addition, in some cases, an amount of a gas to be supplied into the process chamber 201 increases and a film-forming cost (gas cost) increases. Furthermore, depending on a temperature condition, the DS gas is thermally decomposed, even without supplying the TEB gas together. Thus, the technical significance of supplying the TEB gas may be lost. By setting the pressure in the process chamber 201 to be 100 Pa or less, the pressure in the process chamber 201 is raised in a short time, thereby improving productivity of the film-forming process. In addition, it is possible to reduce the amount of the gas to be supplied into the process chamber 201 and to reduce the gas cost. Moreover, it is possible to effectively use the catalytic action of the TEB gas when the DS gas is decomposed, thereby obtaining the technical significance of supplying the TEB gas.

The supply flow rate of the DS gas, which is controlled by the MFC 241a, is set to a flow rate within a range of, for example, 10 sccm to 1,000 sccm. The supply flow rate of the TEB gas, which is controlled by the MFC 241b, is set to a flow rate within a range of, for example, 1 sccm to 100 sccm. The supply flow rates of the $N_2$ gases, which are controlled by the MFCs 241c and 241d, are respectively set to a flow rate within a range of, for example, 100 sccm to 10,000 sccm.

The time to supply the DS gas and the TEB gas to the wafer 200, that is, the execution time of the CVD film-forming step, is set to a time within a range of, for example, 10 seconds to 60 seconds.

The temperature of the heater 207 is set such that the temperature of the wafer 200 is set to a temperature within a range of, for example, 200° C. to 400° C., and preferably 300° C. to 400° C.

When the temperature of the wafer 200 is less than 200° C., a film-forming reaction on the wafer 200 hardly proceeds, and thus, a practical deposition rate cannot be obtained. By setting the temperature of the wafer 200 to be 200° C. or more, the film-forming reaction on the wafer 200 is made to proceed, and thus, the practical deposition rate can be obtained. By setting the temperature of the wafer 200 to be 300° C. or more, the film-forming reaction on the wafer 200 is accelerated, and thus, the deposition rate can be further increased.

When the temperature of the wafer 200 is higher than 400° C., the DS gas is thermally decomposed even without supplying the TEB gas together. Thus, the technical significance of supplying the TEB gas may be lost. In addition, in a case where the DS gas and the TEB gas are supplied together, an excessive gas phase reaction occurs and film thickness uniformity easily deteriorates. Thus, the control thereof may be made difficult. By setting the temperature of the wafer 200 to be 400° C. or less, it is possible to effectively use the catalytic action of the TEB gas when the DS gas is decomposed, thereby obtaining the technical significance of supplying the TEB gas. In addition, in a case where the DS gas and the TEB gas are supplied together, an appropriate gas phase reaction occurs and the deterioration of film thickness uniformity is suppressed, thus making the control thereof possible.

Therefore, it is desirable that the temperature of the wafer 200 is set to a temperature within a range of 200° C. to 400° C., and preferably 300° C. to 400° C. This temperature condition is a condition that the DS gas is not self-decomposed (thermally decomposed) when the DS gas is present alone.

By supplying the DS gas and the TEB gas together to the wafer 200 under the above-described condition, these gases can appropriately react with each other in the process chamber 201. Due to the catalytic action of the TEB gas, it is possible to decompose the DS gas, that is, to cut at least some of Si—H bonds in the DS gas. Si of the DS gas that has a dangling bond caused by desorbing H is quickly adsorbed and deposited on the wafer 200. As a result, the formation of the Si film on the wafer 200 proceeds at a practical deposition rate.

As described above, in the present embodiment, the temperature condition in the process chamber 201 in the CVD film-forming step is a condition that the DS gas is not thermally decomposed when the DS gas is supplied alone into the process chamber 201. Even under such a temperature condition, the film-forming process can proceed at the practical deposition rate because the TEB gas acts as a catalyst. However, the TEB gas itself in the present embodiment may be changed before and after the reaction. That is, at least a portion of the TEB gas may be decomposed by the reaction with the DS gas, and a compound containing H, B, C, or the like may be produced. Therefore, the TEB gas in the reaction system of the present embodiment acts as a catalyst, but strictly, the TEB gas may be regarded as being different from the catalyst. It may be considered that the action of the TEB gas as the catalyst is caused by a polarity of a TEB molecule.

As the silicon hydride, in addition to the DS gas, a material such as a monosilane ($SiH_4$) gas, a trisilane ($Si_3H_8$) gas, a tetrasilane ($Si_4H_{10}$) gas, or the like, can be used. That is, as the silicon hydride, a material (silane) represented by the general formula of $Si_nH_{2n+2}$ (n is an integer equal to or larger than 1) can be used. A material (higher order silane) represented by the general formula in which n is an integer equal to or larger than 2 can be used.

As the catalyst, in addition to the TEB gas, for example, a material such as methylborane ($CH_3BH_2$), ethylborone ($C_2H_5BH_2$), butylborane ($C_4H_9BH_2$), dimethylborane (($CH_3)_2BH$), diethylborane (($C_2H_5)_2BH$), trimethylborane (($CH_3)_3B$), triethylborane (($C_2H_5)_3B$), tripropylborane (($C_3H_7)_3B$), triisopropylborane ($[(CH_3)_2CH]_3B$), tributylborane (($C_4H_9)_3B$), triisobutylborane ($[(CH_3)_2CHCH_2]_3B$), or the like can be used. That is, as the catalyst, an alkylborane (in the formulae, x is an integer of 1 to 3) gas (alkylborane-based gas) represented by any one of the following general formulas: $(CH_3)_xBH_{3-x}$, $(C_2H_5)_xBH_{3-x}$, $(C_3H_7)_xBH_{3-x}$, $[(CH_3)_2CH]_xBH_{3-x}$, and $(C_4H_9)_xBH_{3-x}$, $[(CH_3)_2CHCH_2]_xBH_{3-x}$ can be used. The alkylborane-based gas is a gas that does not contain a halogen element, but contains B as a group III element and includes an alkyl group, which may be a methyl group, an ethyl group, a butyl group, a propyl group, an isopropyl group, a butyl group, an isobutyl group, or the like.

In addition, as the catalyst, for example, a material such as methylphosphine ($CH_3PH_2$), ethylphosphine ($C_2H_5PH_2$), butylphosphine ($C_4H_9PH_2$), diethylphosphine (($C_2H_5)_2PH$), diisopropylphosphine ($[(CH_3)_2CH]_2PH$), dibutylphosphine (($C_4H_9)_2PH$), diisobutylphosphine ($[(CH_3)_2CHCH_2]_2PH$), trimethylphosphine (($CH_3)_3P$), triethylphosphine (($C_2H_5)_3P$), tripropylphosphine (($C_3H_7)_3P$), triisopropylphosphine ($[(CH_3)_2CH]_3P$), tributylphosphine (($C_4H_9)_3P$), triisobutylphosphine ($[(CH_3)_2CHCH_2]_3P$), or the like can be used. That is, as the catalyst, an alkylphosphine (in the formulae, x is an integer of 1 to 3) gas (alkylphosphine-based gas) represented by any one of the following general formulas: $(CH_3)_xPH_{3-x}$, $(C_2H_5)_xPH_{3-x}$, $(C_3H_7)_xPH_{3-x}$, $[(CH_3)_2CH]_xPH_{3-x}$, $(C_4H_9)_xPH_{3-x}$, $[(CH_3)_2CHCH_2]_xPH_{3-x}$ can be used. The alkylphosphine-based gas is a gas that does not contain a halogen element, but contains phosphorus (P) as a group V element and includes an alkyl group.

In addition, as the catalyst, for example, a material such as methylamine ($CH_3NH_2$), ethylamine ($C_2H_5NH_2$), propylamine ($C_3H_7NH_2$), isopropylamine ($[(CH_3)_2CH]NH_2$), butylamine ($C_4H_9NH_2$), isobutylamine ($[(CH_3)_2CHCH_2]NH_2$), dimethylamine (($CH_3)_2NH$), diethylamine (($C_2H_5)_2NH$), dipropylamine ($(C_3H_7)_2NH$), diisopropylamine ($[(CH_3)_2CH]_2NH$), dibutylamine (($C_4H_9)_2NH$), diisobutylamine ($[(CH_3)_2CHCH_2]_2NH$), trimethylamine (($CH_3)_3N$), triethylamine (($C_2H_5)_3N$), tripropylamine (($C_3H_7)_3N$), triisopropylamine ($[(CH_3)_2CH]_3N$), tributylamine (($C_4H_9)_3N$), triisobutylamine ($[(CH_3)_2CHCH_2]_3N$), or the like can be used. That is, as the catalyst, an amine (in the formulae, x is an integer of 1 to 3) gas (amine-based gas) represented by any one of the following general formulas: $(CH_3)_xNH_{3-x}$, $(C_2H_5)_xNH_{3-x}$, $(C_3H_7)_xNH_{3-x}$, $[(CH_3)_2CH]_xNH_{3-x}$, $(C_4H_9)_xNH_{3-x}$, $[(CH_3)_2CHCH_2]_xNH_{3-x}$ can be used. The amine-based gas is a gas that does not contain a halogen element, but contains N as a group V element and includes an alkyl group.

As the catalyst, for example, a material such as methylhydrazine (($CH_3)HN_2H_2$), ethylhydrazine (($C_2H_5)HN_2H_2$), dimethylhydrazine (($CH_3)_2N_2H_2$), diethylhydrazine (($C_2H_5)_2N_2H_2$), trimethylhydrazine (($CH_3)_2N_2(CH_3)H$), triethylhydrazine (($C_2H_5)_2N_2(C_2H_5)H$), or the like, that is, an alkylhydrazine gas (alkylhydrazine-based gas) can be used. The alkylhydrazine-based gas is a gas that does not contain a halogen element, but contains N as a group V element and includes an alkyl group.

As the inert gas, in addition to the $N_2$ gas, for example, a rare gas such as an Ar gas, a He gas, a Ne gas, a Xe gas, or the like may be used.

(After-Purge Step and Atmospheric Pressure Returning Step)

When the CVD film-forming step is completed and the Si film having a predetermined film thickness is formed, the valves 243a and 243b are closed and the supply of the DS gas and the TEB gas into the process chamber 201 is stopped. In addition, the $N_2$ gas is supplied into the process chamber 201 from each of the gas supply pipes 232c and 232d and is exhausted from the exhaust pipe 231. The $N_2$ gas acts as a purge gas. Due to this, the inside of the process chamber 201 is purged, so that the gas or the reaction by-product remaining in the process chamber 201 is removed from the process chamber 201 (after-purging). Subsequently, the atmosphere in the process chamber 201 is replaced with the inert gas (inert gas replacement) and the pressure in the process chamber 201 is returned to the atmospheric pressure (atmospheric pressure returning).

(Unloading Step)

Subsequently, the seal cap 219 is moved downward by the boat elevator 115. The lower end of the manifold 209 is opened and the boat 217 is unloaded from the lower end of the manifold 209 to the outside of the reaction tube 203 in a state in which the processed wafers 200 are held by the boat 217 (boat unloading). After the boat unloading, the shutter 219s is moved and the lower end of the manifold 209 is sealed through the O-ring 220c by the shutter 219s (shutter closing). The processed wafers 200 are unloaded to the outside of the reaction tube 203 and, subsequently, are discharged from the boat 217 (wafer discharging).

(3) Effects of the Present Embodiment

According to the present embodiment, one or more effects described below can be obtained.

(a) In the CVD film-forming step, by supplying the DS gas and the TEB gas together to the wafer 200, the formation of the Si film on the wafer 200 can proceed at a practical deposition rate under a low temperature condition that the DS gas is not thermally decomposed when the DS gas is present alone. By performing the film formation under the low temperature condition, a thermal damage to the wafer 200 can be reduced and a thermal history can be well controlled.

(b) By using the gas that does not contain no halogen element, such as Cl or the like, as the catalyst, the mixing of Cl or the like into the Si film formed on the wafer 200 can be avoided. Due to this, the Si film formed on the wafer 200 can be made as a high quality film having high ashing resistance and high etching resistance.

This is because in a case where the Si film is formed by using the DS gas and the gas containing the halogen element (Cl) such as, for example, a trichloroborane ($BCl_3$) gas, Cl contained in the $BCl_3$ can be mixed into the Si film in a small amount. Cl contained in the Si film acts to attract moisture ($H_2O$) or the like. Therefore, when the surface of the Si film containing Cl is exposed to the atmosphere, $H_2O$ or the like contained in the atmosphere may be attracted to Cl and may be incorporated into the film. As a result, a lot of impurities such as O or the like are incorporated into the Si film. O incorporated into the Si film reduces etching resistance of the Si film, or affects the characteristics or reliability of the semiconductor device formed on the wafer 200.

In the present embodiment, since the TEB gas that does not contain a halogen element, such as Cl or the like, is used as the catalyst, the mixing of Cl or the like into the Si film can be avoided. As a result, when the wafer 200 after the film-forming process is unloaded to the atmosphere (furnace throat is opened), the incorporation of $H_2O$ into the Si film exposed to the atmosphere due to Cl can be avoided. That is, the Si film formed on the wafer 200 can be made as a film that is harder to oxidize than a Si film containing Cl, i.e., a film having high ashing resistance. As a result, the Si film formed on the wafer 200 can be maintained in a high quality state in which an O concentration is low, that is, a state in which etching resistance is high.

(c) The use of the TEB gas as the catalyst can increase the deposition rate of the Si film formed on the wafer 200, as compared with the case of using the $BCl_3$ gas as the catalyst. This is because, in a case where the $BCl_3$ gas is used as the catalyst, the Si film being deposited may be etched by the $BCl_3$ gas and, thus, the deposition rate may be reduced. In contrast, in a case where the halogen element-free TEB gas is used as the catalyst, the etching of the Si film does not occur, and thus, the reduction in the deposition rate can be avoided.

(d) By using the TEB gas containing the alkyl group (ethyl group) as the catalyst, C contained in the ethyl group can be added to the Si film formed on the wafer 200 in a very small amount, for example, at an atomic concentration of 3% to 4%. Due to this, the Si film formed on the wafer 200 can be made as a film having higher etching resistance than the Si film formed by using the DS gas and the $BCl_3$ gas, i.e., the Si film formed by using the C-free gas.

(e) In the CVD film-forming step, the TEB gas to be supplied to the wafer 200 is diluted by supplying the $N_2$ gas into the process chamber 201 together with the TEB gas or the like. The film quality or the deposition rate of the Si film to be formed on the wafer 200 can be adjusted by controlling the degree of dilution.

For example, by increasing a dilution rate of the TEB gas to be supplied to the wafer 200 (by reducing the concentration), it is possible to suppress the mixing of the component contained in the TEB gas into the Si film and to reduce the impurity concentration of B or C in the Si film. B contained in the Si film tends to form boron oxide ($B_2O_3$) when an ashing process of supplying, for example, oxygen ($O_2$) plasma to the Si film is performed, and may be a factor to reduce ashing resistance of the film. The ashing resistance of the Si film can be improved by reducing a B concentration in the Si film. As a result, the reduction in the ashing resistance of the Si film can be avoided. In addition, for example, by reducing the dilution rate of the TEB gas (by increasing the concentration), it is possible to easily exhibit the catalytic action of the TEB gas and to increase the deposition rate of the Si film.

As such, by appropriately controlling the dilution rate of the TEB gas to be supplied to the wafer 200, it is possible to achieve both the impurity concentration in the Si film and the deposition rate of the Si film with good balance. The dilution rate of the TEB gas may be changed in the course of the CVD film-forming step. For example, in an initial stage of the film-forming process in which it is difficult to obtain the deposition rate, the dilution rate of the TEB gas may be made lower than the dilution rate of the TEB gas in a mid stage to a later stage of the film-forming process, so as to increase the deposition rate. In addition, in a case where high ashing resistance to the surface layer portion of the Si film is required, the dilution rate of the TEB gas may be made higher in the later stage of the film-forming process than the dilution rate of the TEB gas in the initial stage to the mid stage of the film-forming process, so as to reduce the impurity concentration in the surface layer portion.

(f) The above-described various effects can also be exerted in the case of using the silicon hydride other than the DS gas or in the case of using catalysts other than the TEB gas.

(4) Modification Examples

The film-forming sequence according to the present embodiment is not limited to the aspect illustrated in FIG. 4A, and can be modified as follows.

Modification Example 1

As in the film-forming sequence illustrated in FIG. 4B or illustrated below, before the CVD film-forming step is performed, a step (seed layer forming step) of forming a seed layer on the wafer 200 may be performed by supplying, for example, the DS gas as the silicon hydride to the wafer 200.

In the seed layer forming step, in a state where the valves 243b to 243d are closed, the valve 243a is opened and the DS gas is supplied into the gas supply pipe 232a. The DS gas is supplied to the wafer 200, without being diluted, and is exhausted from the exhaust pipe 231.

At this time, the APC valve 244 is appropriately adjusted such that the pressure in the process chamber 201 is set to a pressure equal to or greater than the pressure in the process chamber 201 in the above-described CVD film-forming step and, preferably, to a pressure greater than that. The pressure in the process chamber 201 is set to a pressure within a range of, for example, 120 Pa to 931 Pa, and preferably 120 Pa to 665 Pa.

When the pressure in the process chamber 201 is less than 120 Pa, it may be difficult to form the seed layer. By setting the pressure in the process chamber 201 to be 120 Pa or more, it is possible to form the seed layer.

When the pressure in the process chamber 201 is greater than 931 Pa, it may take a long time to raise the pressure in the process chamber 201, and thus, productivity of the film-forming process may be reduced. In addition, an excessive gas phase reaction may occur. Thus, Si may be deposited on the wafer 200 and it may be difficult to form the seed layer (adsorption layer of the DS to be described below) on the wafer 200. In addition, the amount of the DS gas to be supplied into the process chamber 201 may increase and the film-forming cost may increase. By setting the pressure in the process chamber 201 to be 931 Pa or less, the pressure in the process chamber 201 is raised in a short time, thereby improving productivity of the film-forming process. In addition, it is possible to reduce the amount of the gas to be supplied into the process chamber 201 and to reduce the film-forming cost. By setting the pressure in the process chamber 201 to be 665 Pa or less, the pressure in the process chamber 201 is raised in a shorter time, thereby further improving productivity of the film-forming process. In addition, it is possible to further reduce the amount of the gas to be supplied into the process chamber 201 and to further reduce the film-forming cost.

The supply flow rate of the DS gas is set to be a flow rate equal to or greater than the supply flow rate of the DS gas in the CVD film-forming step, and preferably a flow rate greater than that. The supply flow rate of the DS gas is set to a flow rate within a range of, for example, 100 sccm to 2,000 sccm.

The supply time of the DS gas (execution time of the seed layer forming step) is a time equal to or longer than the supply time of the DS gas in the CVD film-forming step, and preferably a time longer than that. The supply time of the DS gas is set to a time within a range of, for example, 15 minutes to 90 minutes.

The temperature of the wafer 200 is equal to the temperature of the wafer 200 in the CVD film-forming step.

By supplying the DS gas to the wafer 200 under the above-described condition, the adsorption layer of the DS is formed on the wafer 200 as the seed layer. DS molecules constituting the adsorption layer of the DS include those in which some bonds of Si and H are cut. That is, the adsorption layer of the DS may be a physical adsorption layer of the DS, may be a chemical adsorption layer of the DS, or may include both of them. The seed layer formed under the above-described condition is a layer continuously covering the surface of the wafer 200, that is, a layer of 1-molecule layer or more.

After the execution of the seed layer forming step is completed, the valve 243a is closed, and the supply of the DS gas into the process chamber 201 is stopped. At this time, the APC valve 244 is maintained in the opened state, and the inside of the process chamber 201 is vacuum-exhausted by the vacuum pump 246. The unreacted DS gas remaining in the process chamber 201 or the DS gas remaining after contributing to the formation of the seed layer in the chamber is exhausted from the process chamber 201. At this time, the valves 243c and 243d may be opened and the $N_2$ gas may be supplied into the process chamber 201. The $N_2$ gas acts as a purge gas. This can increase the effect that the unreacted DS gas remaining in the process chamber 201 or the DS gas remaining after contributing to the formation of the seed layer are removed from the process chamber 201.

At this time, the gases remaining in the process chamber 201 may not be completely removed, and the inside of the process chamber 201 may not be completely purged. When the amount of the gas remaining in the process chamber 201 is small, an adverse effect does not occur in the CVD film-forming step that is subsequently performed. The flow rate of the $N_2$ gas to be supplied to the process chamber 201 need not be large, either. For example, by supplying substantially the same amount as the volume of the reaction tube 203 (process chamber 201), the purge can be performed to the extent that an adverse effect does not occur in the CVD film-forming step. In this way, by not completely purging the inside of the process chamber 201, the purge time can be reduced and the throughput can be improved. In addition, it is possible to minimize the consumption of the $N_2$ gas. When the formation of the seed layer is completed, the CVD film-forming step may be performed without purging the inside of the process chamber 201.

In the present modification example, the same effects as those of the film-forming sequence illustrated in FIG. 4A can be obtained.

In addition, by previously forming the seed layer on the wafer 200 before the CVD film-forming step is performed, it is possible to shorten the incubation time of the Si film formed thereon. Therefore, it is possible to suppress the total supply amount of the DS gas or the TEB gas in the CVD film-forming step. That is, it is possible to reduce the amount of the DS gas or the TEB gas that is discharged without contributing to the film-forming process and to reduce the film-forming cost of the Si film. In addition, by forming the continuous layer as the seed layer, a timing of starting the growth of the Si film can be uniformly aligned over the entire surface of the wafer 200. Therefore, the film thickness uniformity or surface roughness of the Si film in the plane of the wafer 200 can be improved. Here, the term "surface roughness" means a height difference in the wafer plane and has the same meaning as surface coarseness. The improvement in the surface roughness means that the height difference is reduced and, the surface is smoothed. The deterioration in the surface roughness means that the height difference is increased and the surface becomes rough.

In addition, by setting the pressure in the process chamber 201 in the seed layer forming step to be greater than the pressure in the process chamber 201 in the CVD film-forming step, the seed layer can be densified and the continuous layer having no pin-hole can be easily and reliably formed. Therefore, the above-described effects can be obtained. In addition, it is possible to increase the forming rate of the seed layer and improve the total productivity of the film-forming process.

These effects can also be obtained by setting the supply flow rate of the DS gas in the seed layer forming step to be a flow rate equal to or greater than the supply flow rate of the DS gas in the CVD film-forming step. In addition, these effects can be more reliably obtained when the supply flow rate of the DS gas in the seed layer forming step is set to be greater than the supply flow rate of the DS gas in the CVD film-forming step.

In addition, these effects can also be obtained by setting the supply time of the DS gas in the seed layer forming step to be a time equal to or longer than the supply time of the DS gas in the CVD film-forming step. In addition, these effects can be more reliably obtained when the supply time of the DS gas in the seed layer forming step is set to be longer than the supply time of the DS gas in the CVD film-forming step.

In addition, these effects can also be obtained by supplying the $N_2$ gas to the wafer 200 together with the DS gas or the like in the seed layer forming step and the CVD film-forming step and by setting the dilution rate of the DS in the seed layer forming to be equal to or less than the dilution rate of the DS gas and the TEB gas in the CVD film-forming step. In addition, these effects can be more reliably obtained when the dilution rate of the DS in the seed layer forming step is set to be less than the dilution rate of the DS gas and the TEB gas in the CVD film-forming step. For example, as in the present modification example, these effects can be more reliably obtained by supplying the DS gas in the seed layer forming step, without diluting the DS gas.

In the seed layer forming step, when the DS gas is supplied into the process chamber 201, the exhaust of the DS gas from the process chamber 201 may be stopped and the DS gas in the process chamber 201 may be confined in the process chamber 201. In this case, in the seed layer forming step, the APC valve 244 may be fully closed (full close) or may be slightly opened. In a case where the APC valve 244 is fully closed, the maximum pressure in the process chamber 201 can be increased and the continuous layer having no pin-hole can be formed more easily and reliably by densifying the seed layer, as compared with a case where the APC valve 244 is slightly opened. In a case where the APC valve 244 is slightly opened, a slight flow of the DS gas directed from the process chamber 201 toward the exhaust pipe 231 can be formed, and a reverse diffusion of a foreign matter directed from the exhaust pipe 231 toward the process chamber 201 can be suppressed.

As the silicon hydride used in the seed layer forming step, in addition to the DS gas, a material represented by $Si_nH_{2n+2}$, such as $SiH_4$ gas, $Si_3H_8$ gas, or $Si_4H_{10}$ gas as described above can be used. In the seed layer forming step and the CVD film-forming step, different types of a silicon hydride may be used.

In the seed layer forming step, in addition to the silicon hydride, for example, silicon chloride (chlorosilane source gas) such as monochlorosilane ($SiH_3Cl$), dichlorosilane ($SiH_2Cl_2$), trichlorosilane ($SiHCl_3$), tetrachlorosilane ($SiCl_4$), hexachlorodisilane ($Si_2Cl_6$), octachlorotrisilane ($Si_3Cl_8$), or the like, that is, a silicon halide (halosilane source gas) or an organic silicon compound (aminosilane source gas) such as tetrakis(dimethylamino) silane ($Si[N(CH_3)_2]_4$), tris(dimethylamino)silane ($Si[N(CH_3)_2]_3H$), bis(diethylamino)silane ($Si[N(C_2H_5)_2]_2H_2$), diisopropylaminosilane ($SiH_3N[CH(CH_3)_2]_2$), bis-tertiary-butyl-aminosilane ($SiH_2[NH(C_4H_9)]_2$) may be used. For example, as in the following film-forming sequence, the seed layer may be formed by alternately supplying a plurality of types of silicon compounds and, then, the Si film may be formed. When the seed layer is formed, it is preferable to alternately supply a silicon halide and a silicon hydride, or to alternately supply a silicon halide and an organic silicon compound.

Figure 4B:
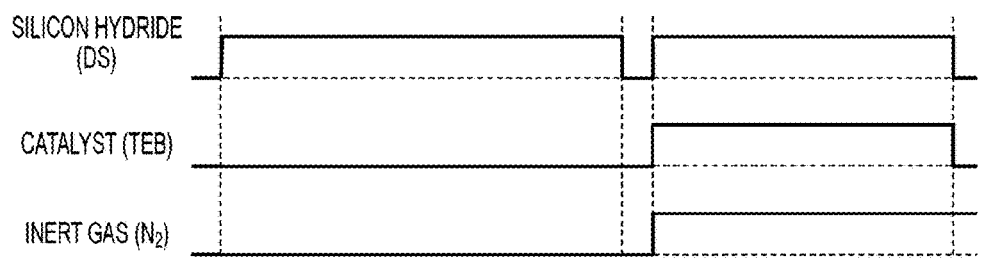
FIG. 4B is a diagram illustrating a modification example of the film-forming sequence according to the embodiment of the present disclosure.

The process condition at this time may be the same as the process condition in the seed layer forming step illustrated in FIG. 4B.

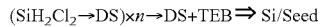

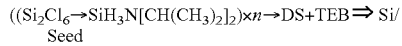

Modification Example 2

Figure 4C:
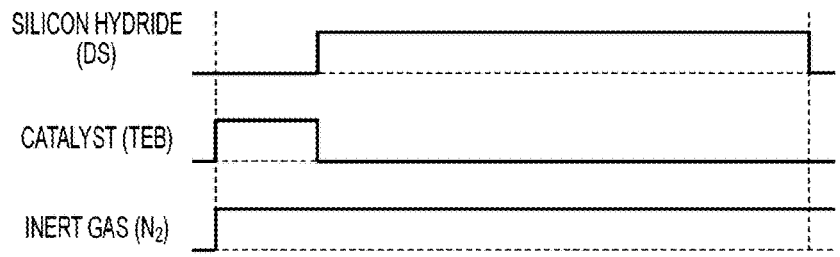
FIG. 4C is a diagram illustrating a modification example of the film-forming sequence according to the embodiment of the present disclosure.

As illustrated in FIG. 4C, in the CVD film-forming step, the TEB gas may be supplied to the wafer 200 first and, then, the DS gas may be supplied to the wafer 200 in a state in which the supply of the TEB gas is stopped. In this case, the film-forming process is started by the catalytic action of the TEB gas supplied first and, then, the film-forming process is continued even without performing the supply of the TEB gas. That is, the TEB gas supplied first acts as a trigger to start the film-forming process. Since the trigger action is used, it is desirable that the supply of the DS gas is started in a state in which a sufficient amount of the TEB gas remains in the process chamber 201. That is, it is desirable that the purge of the process chamber 201 is not performed between the TEB gas supply step and the DS gas supply step. The supply time of the TEB gas is set to a time within a range of, for example, 5 minutes to 10 minutes. The other process conditions are the same as those in the film-forming step illustrated in FIG. 4A.

In the present modification example, the same effects as those of the film-forming sequence illustrated in FIG. 4A can be obtained. In addition, it is possible to suppress the total supply amount of the TEB gas, to suppress the component contained in the TEB gas from being mixed into the Si film, and to reduce the impurity concentration of B or C in the Si film. In addition, it is possible to reduce the film-forming cost of the Si film.

In the CVD film-forming step, after the TEB gas is supplied to the wafer 200 first, the supply of the DS gas may be started in a state in which the supply of the TEB gas is continued (maintained), and the supply of the TEB gas may be stopped during the DS gas supply period. That is, a period of supplying the TEB gas and the DS gas in an overlapping manner may be provided. In this case, it is possible to enhance the action as the trigger to start the film-forming process by the TEB gas.

In addition, in the CVD film-forming step, the supply of the DS gas to the wafer 200 and the supply of the TEB gas to the wafer 200 may be started at the same time and, then, the supply of the TEB gas may be stopped prior to stopping the supply of the DS gas. For example, the supply of the TEB gas may be performed only at the initial stage of the DS gas supply period. Even in this case, the TEB gas supplied together with the DS gas acts as a trigger to start the film-forming process, and the same effects as those of the film-forming sequence illustrated in FIG. 4C can be obtained.

Modification Example 3

Figure 4D:
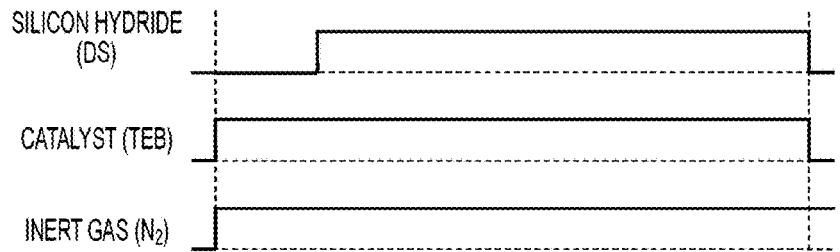
FIG. 4D is a diagram illustrating a modification example of the film-forming sequence according to the embodiment of the present disclosure.

As illustrated in FIG. 4D, in the CVD film-forming step, the TEB gas may be supplied first and, then, the DS gas and the TEB gas may be supplied at the same time. The supply time of the TEB gas supplied first is set to a time within a range of, for example, 5 minutes to 10 minutes. The other process conditions are the same as those in the film-forming step illustrated in FIG. 4A.

In the present modification example, the same effects as those of the film-forming sequence illustrated in FIG. 4A can be obtained. In addition, by supplying the TEB gas first, the film-forming process can be quickly started when the DS gas is supplied, and it is possible to shorten the incubation time of the Si film. Therefore, it is possible to suppress the total supply amount of the DS gas in the CVD film-forming step. That is, it is possible to reduce the amount of the DS gas that is discharged without contributing to the film-forming process and to reduce the film-forming cost of the Si film.

Modification Example 4

Figure 5A:
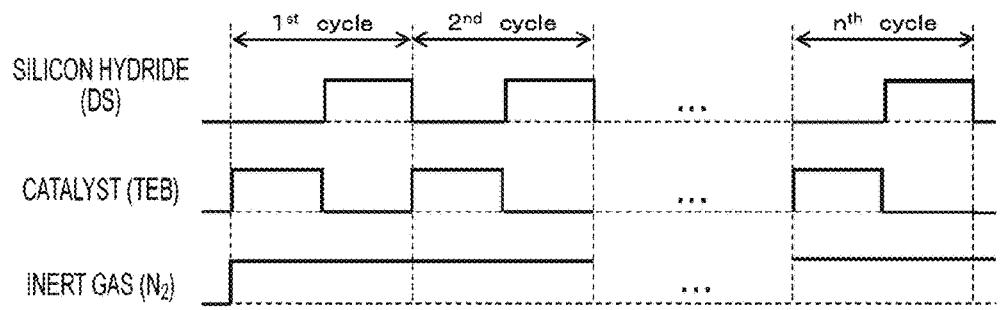
FIG. 5A is a diagram illustrating a modification example of the film-forming sequence according to the embodiment of the present disclosure.

As illustrated in FIG. 5A, it is allowed to perform a cycle, a predetermined number of times (twice or more), that includes the step of supplying the TEB gas to the wafer 200 first and the step of subsequently supplying the DS gas to the wafer 200 in a state in which the supply of the TEB gas is stopped. Even in the present modification example, the same effects as those of the modification example 2 can be obtained. In addition, according to the present modification example, it is possible to reliably continue the film-forming process by repeating the step of supplying the TEB gas first and repeatedly generating the trigger to start the film-forming process in the course of the film-forming process.

Figure 5B:
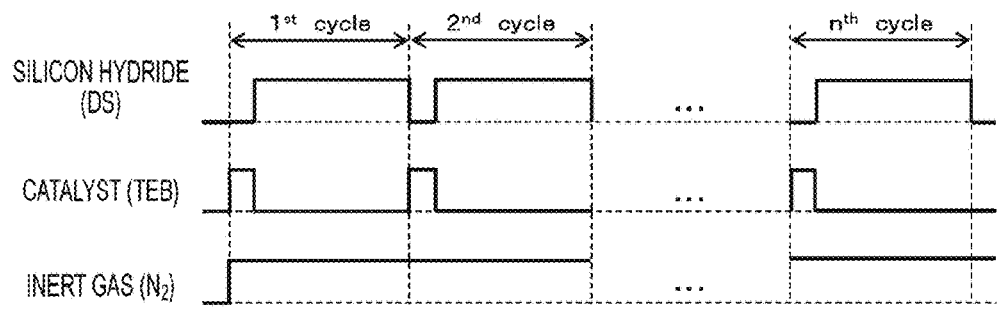
FIG. 5B is a diagram illustrating the modification example of the film-forming sequence according to the embodiment of the present disclosure.

As illustrated in FIG. 5B, when a cycle may be performed a predetermined number of times (twice or more), the cycle including the step of supplying the TEB gas to the wafer 200 first and the step of subsequently supplying the DS gas to the wafer 200 in a state in which the supply of the TEB gas is stopped, the execution time of the step of supplying the TEB gas first may be shorter than the execution time of the step of supplying the DS gas. In the present modification example, the same effects as those of the modification example illustrated in FIG. 5A can be obtained. In addition, according to the present modification example, it is possible to suppress the total amount of the TEE gas and to reduce the film-forming cost of the Si film, as compared with the modification example illustrated in FIG. 5A. In addition, according to the present modification example, it is possible to suppress the component contained in the TEB gas from being mixed into the Si film and to reduce the impurity concentration of B or C in the Si film, as compared with the modification example illustrated in FIG. 5A.

Even in each film-forming sequence illustrated in FIG. 5A or 5B, when the cycle is performed, a period of supplying the TEB gas and the DS gas in an overlapping manner may be provided. In this case, it is possible to enhance the action as the trigger to start the film-forming process by the TEB gas.

Modification Example 5

Figure 5C:
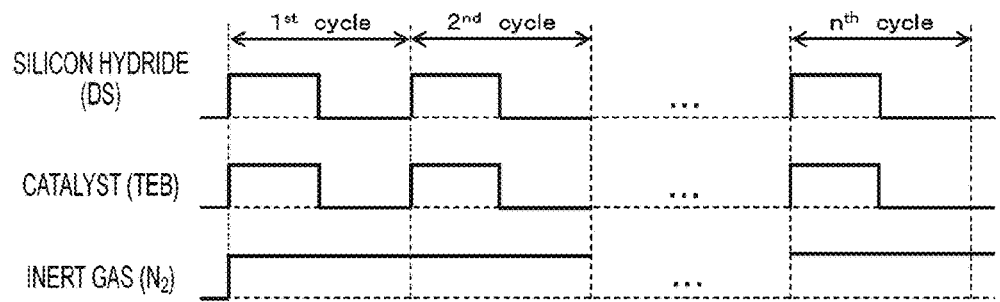
FIG. 5C is a diagram illustrating a modification example of the film-forming sequence according to the embodiment of the present disclosure.

As illustrated in FIG. 5C, the step of supplying the DS gas and the TEB gas to the wafer 200 in the process chamber 201 and the step of exhausting what is contained in the process chamber 201 may be non-simultaneously performed, that is, the cycle, in which the steps are alternately performed without being synchronized, may be performed a predetermined number of times (twice or more). In the present modification example, the same effects as those of the film-forming sequence illustrated in FIG. 4A can be obtained. In addition, according to the present modification example, the film thickness of the Si film can be precisely controlled by controlling the number of times of performing the cycle. In addition, according to the present modification example, by periodically performing the step of exhausting what is contained in the process chamber 201 in the course of the film-forming process, it is possible to suppress the by-product generated during the film-forming process or the components thereof from being mixed into the Si film and to improve the film quality of the Si film.

Figure 6A:
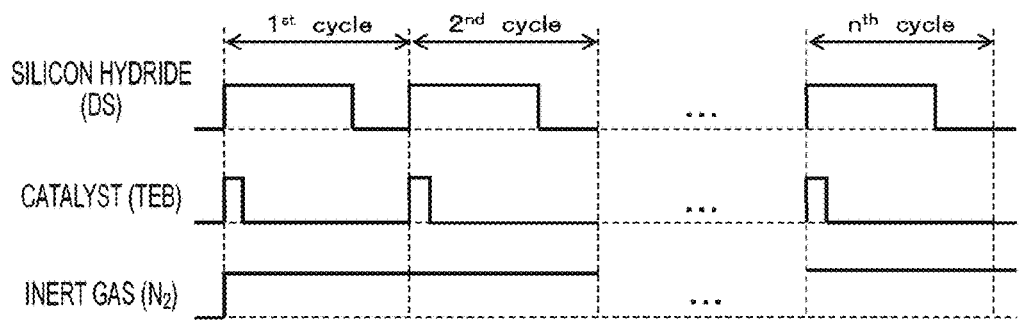
FIG. 6A is a diagram illustrating a modification example of the film-forming sequence according to the embodiment of the present disclosure.

As illustrated in FIG. 6A, when performing the cycle, a predetermined number of times (twice or more), of non-simultaneously performing the step of supplying the DS gas and the TEB gas to the wafer 200 in the process chamber 201 and the step of exhausting what is contained in the process chamber 201, the supply of the TEB gas may be stopped prior to stopping the supply of the DS gas in the step of supplying the DS gas and the TEB gas. That is, after the supply of the TEB gas is stopped, the supply of the DS gas may be stopped. In the present modification example, the same effects as those of the modification example illustrated in FIG. 5C can be obtained. In addition, according to the present modification example, since the TEB gas is used as a trigger to start the film-forming process, the same effects as those of the modification example illustrated in FIG. 4C, 5A, or 5B can be obtained. In addition, according to the present modification example, it is possible to reliably continue the film-forming process by repeatedly generating the trigger to start the film-forming process in the course of the film-forming process.

Modification Example 6

Figure 6B:
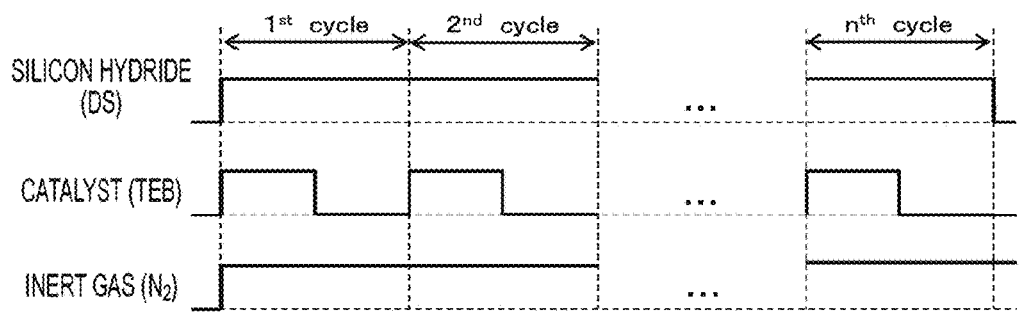
FIG. 6B is a diagram illustrating a modification example of the film-forming sequence according to the embodiment of the present disclosure.
Figure 6C:
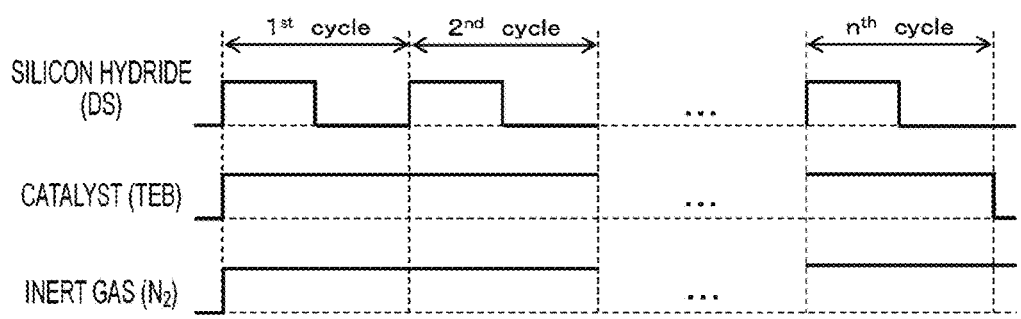
FIG. 6C is a diagram illustrating the modification example of the film-forming sequence according to the embodiment of the present disclosure.

As illustrated in FIG. 6B, the supply of the TEE gas to the wafer 200 may be intermittently performed while the supply of the DS gas to the wafer 200 is continuously performed. In the present modification example, the same effects as those of the film-forming sequence illustrated in FIG. 4A can be obtained. In addition, it is possible to suppress the total supply amount of the TEB gas and to reduce the film-forming cost of the Si film. In addition, even in the present modification example, the same effects as those of the modification example illustrated in FIG. 5A or 5B can be obtained by repeatedly generating the trigger to start the film-forming process in the course of the film-forming process.

As illustrated in FIG. 6O, the supply of the TEB gas to the wafer 200 may be continuously performed while the supply of the DS gas to the wafer 200 is intermittently performed. In the present modification example, the same effects as those of the film-forming sequence illustrated in FIG. 4A can be obtained. In addition, it is possible to suppress the total supply amount of the DS gas and to reduce the film-forming cost of the Si film. In addition, since the TEB gas is continuously supplied, it is possible to arrange an environment in which the film-forming process easily proceeds.

Other Embodiments

So far, the embodiments of the present disclosure have been specifically described. However, the present disclosure is not limited to the above-described embodiments, and various modifications can be made thereto without departing from the scope of the present disclosure.

It is preferable that the process recipes (program in which the process procedures or process conditions are specified) are separately prepared according to the contents of the processing (type of a film to be formed, a composition ratio, film quality, film thickness, process procedures, process conditions, etc.), and are stored in the memory device 121c through the electric communication line or the external memory device 123. It is preferable that, when the substrate processing is started, the CPU 121a appropriately selects a suitable recipe from the plurality of recipes stored in the memory device 121c according to the contents of the processing. Due to this, films having various film types, composition ratios, film qualities, and film thicknesses can be formed with excellent reproducibility by a single substrate processing apparatus. In addition, since the workload of an operator (input/output load of the process procedures, process conditions, etc.) can be reduced, the substrate processing can be promptly started while avoiding erroneous operations.

The above-described recipe is not limited to the case of newly creating a process recipe. For example, the process recipe may be prepared by modifying an existing recipe having already been installed on the substrate processing apparatus. When the recipe is modified, the modified recipe may be installed on the substrate processing substrate through the telecommunication line or the non-transitory computer-readable recording medium storing the corresponding recipe. In addition, the existing recipe having already been installed on the substrate processing apparatus may be directly modified by operating the I/O device 122 provided in the existing substrate processing apparatus.

In the above-described embodiments, the example of forming the film by using a batch-type substrate processing apparatus which processes a plurality of substrates at a time has been described. However, the present disclosure is not limited to the above-described embodiments. For example, the present disclosure can be suitably applied to the case of forming a film by using a single-wafer-type substrate processing apparatus which processes one substrate or a plurality of substrates at a time. In addition, in the above-described embodiments, the example of forming the film by using a hot-wall-type substrate processing apparatus has been described. However, the present disclosure is not limited to the above-described embodiments. For example, the present disclosure can be preferably applied to the case of forming a film by using a cold-wall-type substrate processing apparatus. In these cases, the process procedures and the process conditions can be the same as, for example, the process procedures and the process conditions of the above-described embodiments.

Figure 8:
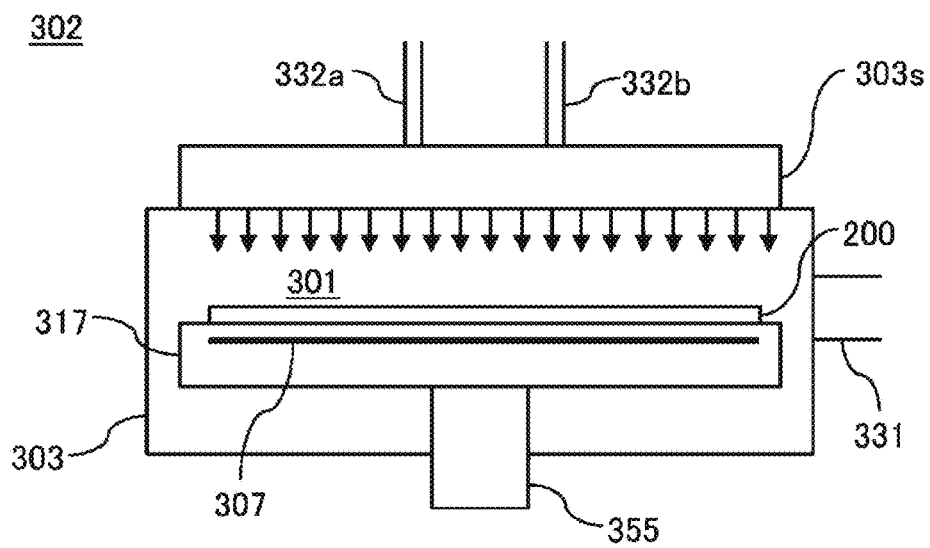
FIG. 8 is a schematic configuration diagram of a process furnace of a substrate processing apparatus suitably used in another embodiment of the present disclosure and a longitudinal sectional view of a process furnace part.

For example, the present disclosure can also be suitably applied to a case in which a film is formed by using a substrate processing apparatus including a process furnace 302 illustrated in FIG. 8. The process furnace 302 includes a process vessel 303 configured to form a process chamber 301, a shower head 303s serving as a gas supply unit configured to supply a gas into the process chamber 301 in a shower shape, a support table 317 configured to support one sheet or a plurality of sheets of wafers 200 in a horizontal posture, a rotational shaft 355 configured to support the support table 317 from below, and a heater 307 provided in the support table 317. Gas supply ports 332a and 332b are connected to an inlet (gas inlet) of the shower head 303s. The same gas supply system as the silicon hydride supply system of the above-described embodiment is connected to the gas supply port 332a. The same supply system as the catalyst supply system of the above-described embodiment is connected to the gas supply port 332b. A gas distribution plate configured to supply a gas into the process chamber 301 in a shower shape is provided in an outlet (gas outlet) of the shower head 303s. The shower head 303s is provided at a position opposite to (facing) the surface of the wafer 200 loaded into the process chamber 301. An exhaust port 331 configured to exhaust what is contained in the process vessel 303 is provided in the process chamber 301.

The same exhaust system as the exhaust system of the above-described embodiment is connected to the exhaust port 331.

Figure 9:
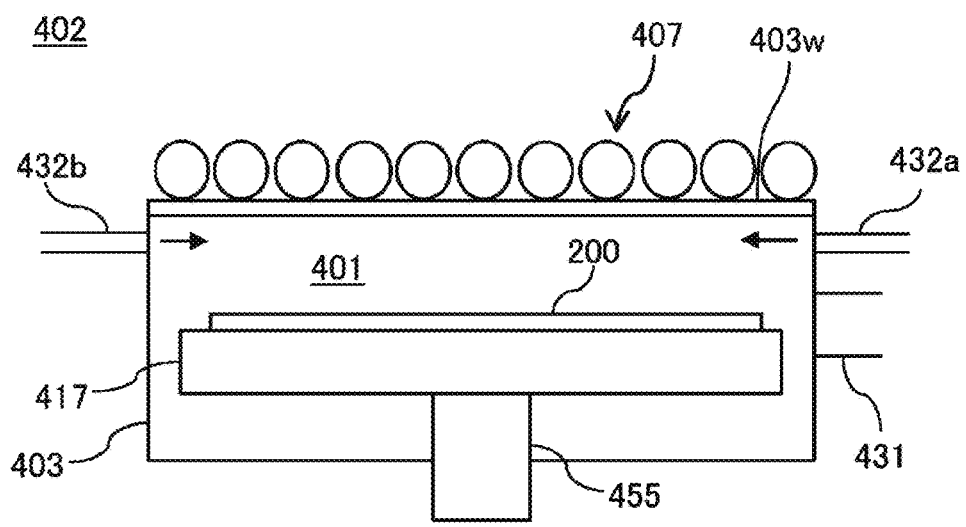
FIG. 9 is a schematic configuration diagram of a process furnace of a substrate processing apparatus suitably used in another embodiment of the present disclosure and a longitudinal sectional view of a process furnace part.

In addition, for example, the present disclosure can also be suitably applied to a case in which a film is formed by using a substrate processing apparatus including a process furnace 402 illustrated in FIG. 9. The process furnace 402 includes a process vessel 403 configured to form a process chamber 401, a support table 417 configured to support one sheet or a plurality of sheets of wafers 200 in a horizontal posture, a rotational shaft 455 configured to support the support table 417 from below, a lamp heater 407 configured to irradiate light toward the wafers 200 in the process vessel 403, and a quartz window 403w configured to transmit the light of the lamp heater 407. Gas supply ports 432a and 432b are connected to the process vessel 403. The same gas supply system as the silicon hydride supply system of the above-described embodiment is connected to the gas supply port 432a. The same supply system as the catalyst supply system of the above-described embodiment is connected to the gas supply port 432b. The gas supply ports 432a and 432b are provided at sides of edges of the wafers 200 loaded into the process chamber 401, that is, positions that are not opposite to the surfaces of the wafers 200 loaded into the process chamber 401. An exhaust port 431 configured to exhaust what is contained in the process chamber 401 is provided in the process vessel 403. The same exhaust system as the exhaust system of the above-described embodiment is connected to the exhaust port 431.

Even when such a substrate processing apparatus is used, the film-forming process can be performed under the same process procedures and process conditions as those of the above-described embodiments and modification examples, and the same effects as those of the above-described embodiments or modification examples can be obtained.

In addition, the above-described embodiments or modified examples can be used in combination as appropriate. The process condition at this time can be the same as the process procedures and process conditions of the above-described embodiment.

Examples

Hereinafter, experimental results supporting the effects obtained by the embodiments or modification examples will be described.

First, as evaluation samples, Samples 1 to 3 were manufactured as follows.

<Sample 1>

By using the substrate processing apparatus according to the above-described embodiment, Sample 1 in which a seed layer and a Si film were formed on a surface of a wafer in this order was manufactured by the film-forming sequence illustrated in FIG. 4B. A DS gas was used as a silicon hydride, and a TEB gas was used as a catalyst. In a seed layer forming step, a pressure in the process chamber was set to a pressure within a range of 120 Pa to 150 Pa, a supply flow rate of the DS gas was set to a flow rate within a range of 100 sccm to 150 sccm, a gas supply time was set to a time within a range of 30 minutes to 35 minutes, and a temperature of the wafer was set to a temperature within a range of 320° C. to 340° C. In a CVD film-forming step, a pressure in the process chamber was set to a pressure within a range of 50 Pa to 70 Pa, a supply flow rate of the TEB gas was set to a flow rate within a range of 30 sccm to 50 sccm, a supply flow rate of the $N_2$ gas was set to a flow rate within a range of 500 sccm to 700 sccm, and a gas supply time was set to a time within a range of 20 minutes to 25 minutes. The temperature of the wafer and the supply flow rate of the DS gas were the same as those in the seed layer forming step.

<Sample 2>

By using the substrate processing apparatus according to the above-described embodiment, Sample 2 in which a seed layer and a Si film were formed on a surface of a wafer in this order was manufactured by the film-forming sequence illustrated in FIG. 4B. A DS gas was used as a silicon hydride, and a TEB gas was used as a catalyst. In a CVD film-forming step, the supply of the $N_2$ gas, that is, the dilution of the TEB gas by the $N_2$ gas was not performed. The other process conditions were the same as those in manufacturing Sample 1.

<Sample 3>

By using the substrate processing apparatus according to the above-described embodiment, Sample 3 in which a Si film was formed on a surface of a wafer was manufactured by a film-forming sequence of supplying a DS gas to the wafer. The process procedures and process conditions when the DS gas was supplied were the same as the process procedures and process conditions in the seed layer forming step when Samples 1 and 2 were manufactured.

A deposition rate, a B concentration in a film, and an ashing resistance with respect to the Si film of each Sample were evaluated.

Figure 7A:
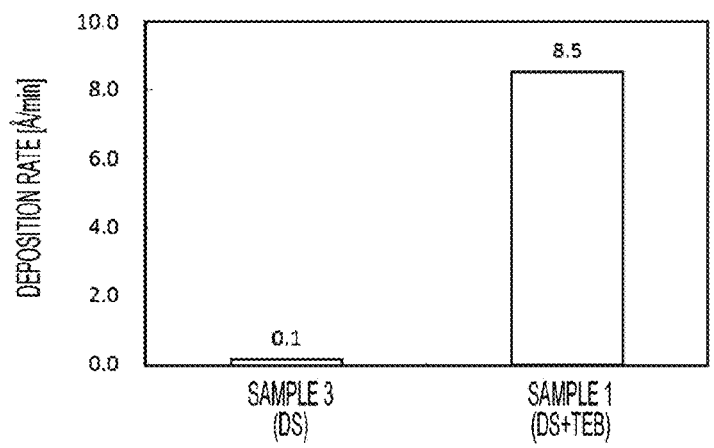
FIG. 7A is a diagram illustrating a deposition rate when a film is formed on a substrate.

FIG. 7A is a diagram illustrating the result of evaluation on the deposition rate of the Si film in Sample 3 and Sample 1. In FIG. 7A, a vertical axis represents the deposition rate [Å/min] and a horizontal axis represents Sample 3 and Sample 1. According to FIG. 7A, the deposition rate of the Si film in manufacturing Sample 1 was about 85 times the deposition rate of the Si film in manufacturing Sample 3. That is, it can be seen that in the case of supplying the TEB gas together with the DS gas in the CVD film-forming step, a high deposition rate can be obtained by the catalytic action of the TEB gas, as compared with the case of not supplying the TEB gas.

Figure 7B:
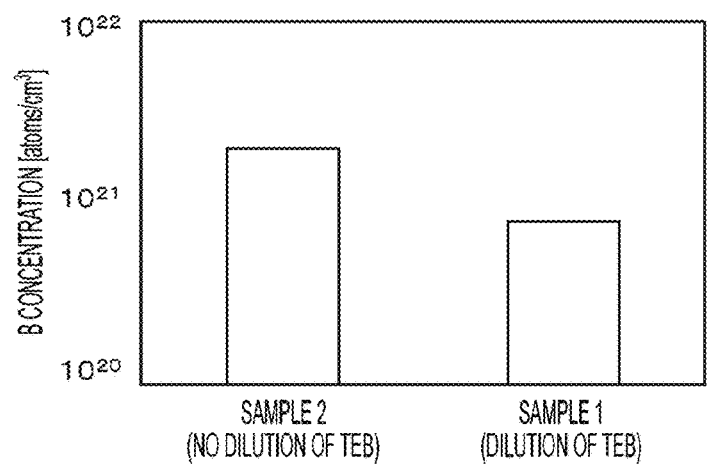
FIG. 7B is a diagram illustrating an impurity concentration (B concentration) in the film formed on the substrate.

FIG. 7B is a diagram illustrating the result of evaluation on the B concentration (atomic concentration of B) in the Si film in Sample 2 and Sample 1. In FIG. 7B, a vertical axis represents the B concentration [atoms/cm$^3$] and a horizontal axis represents Sample 2 and Sample 1. According to FIG. 7B, it can be seen that the B concentration in the Si film in Sample 1 is one order of magnitude smaller than the B concentration in the Si film in Sample 2. That is, it can be seen that it is possible to perform a control in a direction of reducing the B concentration in the Si film by supplying the TEB gas diluted by the $N_2$ gas in the CVD film-forming step.

Figure 7C:
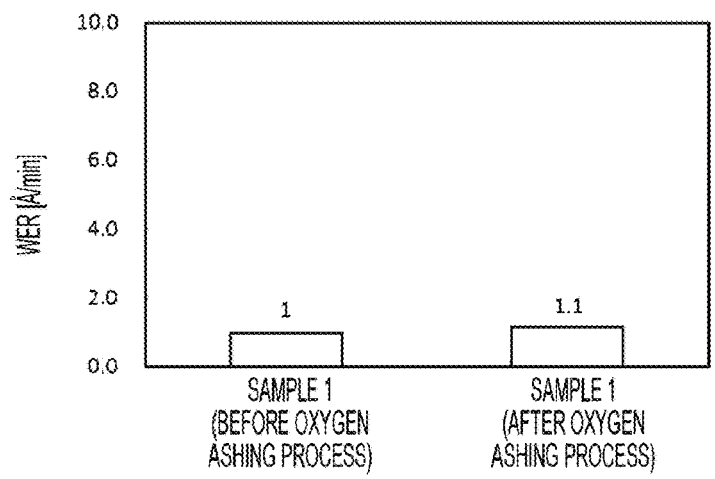
FIG. 7C is a diagram illustrating an etching resistance of the film formed on the substrate.

FIG. 7C is a diagram illustrating the result of evaluation on the ashing resistance of the Si film in Sample 1. In this evaluation, a wet etching rate (WER) when a wet etching process was performed on the Si film was measured at each timing before and after the ashing process was performed. The wet etching process was performed by supplying an HF-containing solution having a concentration of 1% to the Si film. The ashing process was performed by supplying $O_2$ plasma to the Si film. In FIG. 7C, a vertical axis represents the WER [Å/min] and a horizontal axis represents the Si film before and after an oxygen ashing process was performed. According to FIG. 7C, it can be seen that the WER of the Si film in Sample 1 was not substantially changed before and after the oxygen ashing process was performed. It is considered that this is because the Si film in Sample 1 does not contain a halogen element such as Cl or the like, and thus, the Si film is hardly oxidized even after the ashing process, that is, the Si film has high ashing resistance.

It is understood, therefore, that this invention is not limited to the particular embodiments disclosed, but is intended to cover all modifications which are within the spirit and scope of the invention as defined by the appended claims; the above description; and/or shown in the attached drawings.

What is claimed is:

1. A method of manufacturing a semiconductor device, comprising:
    providing a substrate; and
    forming a film on the substrate by supplying a silicon hydride and a halogen element-free catalyst containing one of a group III element or a group V element to the substrate, under a condition that the silicon hydride is not thermally decomposed when the silicon hydride is present alone,
    wherein the catalyst comprises an alkyl group.

2. The method according to claim 1, wherein the catalyst comprises a methyl group, an ethyl group, a propyl group, an isopropyl group, a butyl group, or an isobutyl group.

3. The method according to claim 1, wherein the catalyst comprises an ethyl group.

4. The method according to claim 1, wherein the catalyst comprises a material represented by at least one selected from a group consisting of general formulae of $(CH_3)_x BH_{3-x}$, $(C_2H_5)_x BH_{3-x}$, $(C_3H_7)_x BH_{3-x}$, $[(CH_3)_2CH]_x BH_{3-x}$, $(C_4H_9)_x BH_{3-x}$, $[(CH_3)_2CHCH_2]_x BH_{3-x}$, $(CH_3)_x PH_{3-x}$, $(C_2H_5)_x PH_{3-x}$, $(C_3H_7)_x PH_{3-x}$, $[(CH_3)_2CH]_x PH_{3-x}$, $(C_4H_9)_x PH_{3-x}$, $[(CH_3)_2CHCH_2]_x PH_{3-x}$, $(CH_3)_x NH_{3-x}$, $(C_2H_5)_x NH_{3-x}$, $(C_3H_7)_x NH_{3-x}$, $[(CH_3)_2CH]_x NH_{3-x}$, $(C_4H_9)_x NH_{3-x}$, and $[(CH_3)_2CHCH_2]_x NH_{3-x}$, where x is an integer of 1 to 3.

5. The method according to claim 1 further comprising supplying an inert gas to the substrate, in the forming of the film, and controlling a concentration of an impurity incorporated into the film by a dilution rate of the catalyst by the inert gas.

6. The method according to claim 1, wherein the catalyst is supplied first and then the silicon hydride is supplied in the forming of the film.

7. The method according to claim 1 further comprising, before performing the forming of the film, forming a seed layer on the substrate by supplying the silicon hydride to the substrate.

8. The method according to claim 7, wherein an execution time of the forming of the seed layer is equal to or longer than an execution time of the forming of the film.

9. The method according to claim 7, wherein an execution time of the forming of the seed layer is longer than an execution time of the forming of the film.

10. The method according to claim 7, wherein a pressure of a space where the substrate is present in the forming of the seed layer is set to be equal to or greater than a pressure of the space where the substrate is present in the forming of the film.

11. The method according to claim 7, wherein a pressure of a space where the substrate is present in the forming of the seed layer is set to be greater than a pressure of the space where the substrate is present in the forming of the film.

12. The method according to claim 7 further comprising supplying an inert gas to the substrate in the forming of the seed layer and in the forming of the film, wherein a dilution rate of the silicon hydride and the catalyst in the forming of the seed layer is set to be equal to or less than a dilution rate of the silicon hydride and the catalyst in the forming of the film.

13. The method according to claim 7 further comprising, supplying an inert gas to the substrate in the forming of the seed layer and in the forming of the film, wherein a dilution rate of the silicon hydride and the catalyst in the forming of the seed layer is set to be less than a dilution rate of the silicon hydride and the catalyst in the forming of the film.

14. The method according to claim 1, wherein the silicon hydride comprises a material represented by a general formula of $Si_nH_{2n+2}$, wherein is an integer equal to or larger than 1.

15. The method according to claim 1, wherein the silicon hydride comprises a material represented by a general formula of $Si_nH_{2n+2}$, wherein is an integer equal to or larger than 2.

16. A non-transitory computer-readable recording medium storing a program configured to cause a computer to perform a process in a substrate processing apparatus, the process comprising:
    providing a substrate in a process chamber of the substrate processing apparatus; and
    forming a film on the substrate in the process chamber by supplying a silicon hydride and a halogen element-free catalyst containing one of a group III element or a group V element to the substrate, under a condition that the silicon hydride is not thermally decomposed when the silicon hydride is present alone,
    wherein the catalyst comprises an alkyl group.

* * * * *